United States Patent
Nagashima et al.

(10) Patent No.: US 7,425,504 B2
(45) Date of Patent: Sep. 16, 2008

(54) SYSTEMS AND METHODS FOR PLASMA ETCHING

(75) Inventors: Makoto Nagashima, Tokyo (JP); Dominik Schmidt, Stanford, CA (US)

(73) Assignee: 4D-S Pty Ltd., Perth (AU)

( * ) Notice: Subject to any disclaimer, the term of this patent is extended or adjusted under 35 U.S.C. 154(b) by 0 days.

(21) Appl. No.: 10/966,384

(22) Filed: Oct. 15, 2004

(65) Prior Publication Data

US 2006/0276036 A1  Dec. 7, 2006

(51) Int. Cl.
*H01L 21/44* (2006.01)
*C23C 14/00* (2006.01)

(52) U.S. Cl. ............ 438/674; 438/795; 204/298.16

(58) Field of Classification Search ............ 438/641, 438/674, 738, 792, 795; 204/298.01, 298.04, 204/298.16, 298.19, 298.36
See application file for complete search history.

(56) References Cited

U.S. PATENT DOCUMENTS 6,962,648 B2 * 11/2005 Nagashima et al. .... 204/192.12

* cited by examiner

*Primary Examiner*—W. David Coleman
(74) *Attorney, Agent, or Firm*—Sawyer Law Group LLP

(57) ABSTRACT

Systems and methods are disclosed for processing a semiconductor substrate by depositing a conductive layer on the substrate; patterning a set of insulating structures on the substrate; selectively back-biasing the substrate; depositing a layer of material on the substrate; and removing a part of the conductive layer selectively biased to attract cation bombardment.

20 Claims, 10 Drawing Sheets

SYSTEMS AND METHODS FOR PLASMA ETCHING

BACKGROUND

Semiconductor devices are generally produced by a combination of two processes, i.e., a lithography technique and an etching technique. The lithography technique produces fine patterns on a photosensitive film such as a resist film coated on a surface of a material to be processed, such as a thin film of a semiconductor and a thin film of a magnetic material, which includes a photolithography technique where exposure is conducted with an ultraviolet ray, an electron beam lithography technique where exposure is conducted with an electron beam, and an ion beam lithography technique where exposure is conducted with an ion beam.

The etching technique is a technique of producing a device by transferring the resist pattern produced by the lithography to the material to be processed, such as a thin film of a semiconductor and a thin film of a magnetic material. Conventional etching technique includes a wet etching method, an argon ion milling method and a reactive ion etching method. Among these etching methods, the reactive ion etching method is popular because the pattern produced by the lithography can be precisely transferred.

In the reactive ion etching method, a material to be processed is placed in a plasma of a reactive gas with applying an electric field, and atoms on the surface of the material to be processed are chemically and physically removed by an ion beam incident normally onto the surface of the material to be processed, by which an anisotropic working is possible, where a part not covered with the mask is vertically cut along the edge of the mask. Accordingly, a fine and sharp feature can be transferred by the reactive ion etching method. In the reactive ion etching method, chemical active species such as an ion and a radical of the reactive gas generated in the plasma are adsorbed on the surface of the material to be processed, to chemically react with the material to be processed, and a surface reactive layer having lower bond energy. The surface of the material to be processed is exposed to the impact of cations accelerated by the electric field in the plasma, and thus the surface reactive layer having the lower bond energy is removed by the sputtering effect by ions or the evaporation effect of itself. That is, the reactive ion etching method is a process, which proceeds with a chemical action and a physical action simultaneously. As a result, the selectivity of etching only a specific material, and the anisotropy of vertically etching the surface of the material to be processed can be realized.

SUMMARY

In one aspect, systems and methods are disclosed for processing a semiconductor substrate by depositing a conductive layer on the substrate; patterning a set of insulating structures on the substrate; selectively back-biasing the substrate; depositing a layer of material on the substrate; and removing a part of the conductive layer selectively biased to attract cation bombardment.

In another aspect, a face target sputtering apparatus to fabricate semiconductors includes an air-tight chamber in which an inert gas is admittable and exhaustible; a pair of target plates placed at opposite ends of said air-tight chamber respectively so as to face each other and form a plasma region therebetween; a pair of magnets respectively disposed adjacent to said target plates such that magnet poles of different polarities face each other across said plasma region thereby to establish a magnetic field of said plasma region between said target plates; a substrate holder disposed adjacent to said plasma region, said substrate holder adapted to hold a substrate on which an alloyed thin film is to be deposited; and a back-bias power supply coupled to the substrate holder, wherein the substrate is selectively back-biased prior to face target sputtering with a metal to form a pattern on the layer.

In yet another aspect, systems and methods for processing a semiconductor substrate includes depositing a layer of mask material on the substrate; depositing a resist film; exposing the resist film in a lithographic system and then developing the resist film to form a pattern on the resist film; dissolving the resist film to form a mask; selectively back-biasing the substrate; and removing the part of the film which is not covered by said mask by face target sputtering with a metal to form a pattern on the layer.

Advantages of the invention may include one or more of the following. Since the process can etch and deposit in the same chamber without removing the substrate, the total process time is much shorter. Also, many materials cannot be exposed to air during processing, so by keeping the substrate and the deposited layers at vacuum throughout the processing results in an improved process. Finally, the substrate temperature required in forming the thin films using sputter deposition and sputter etch is typically below 400 degrees centigrade. Since the thin film is formed at a very low temperature during substantially the whole process, the process can be applied to a highly integrated device to deposit an additional layer with a plurality of elements without damaging other elements previously deposited using conventional deposition.

BRIEF DESCRIPTION OF THE FIGURES

In order that the manner in which the above-recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which.

DESCRIPTION

Figure 1:
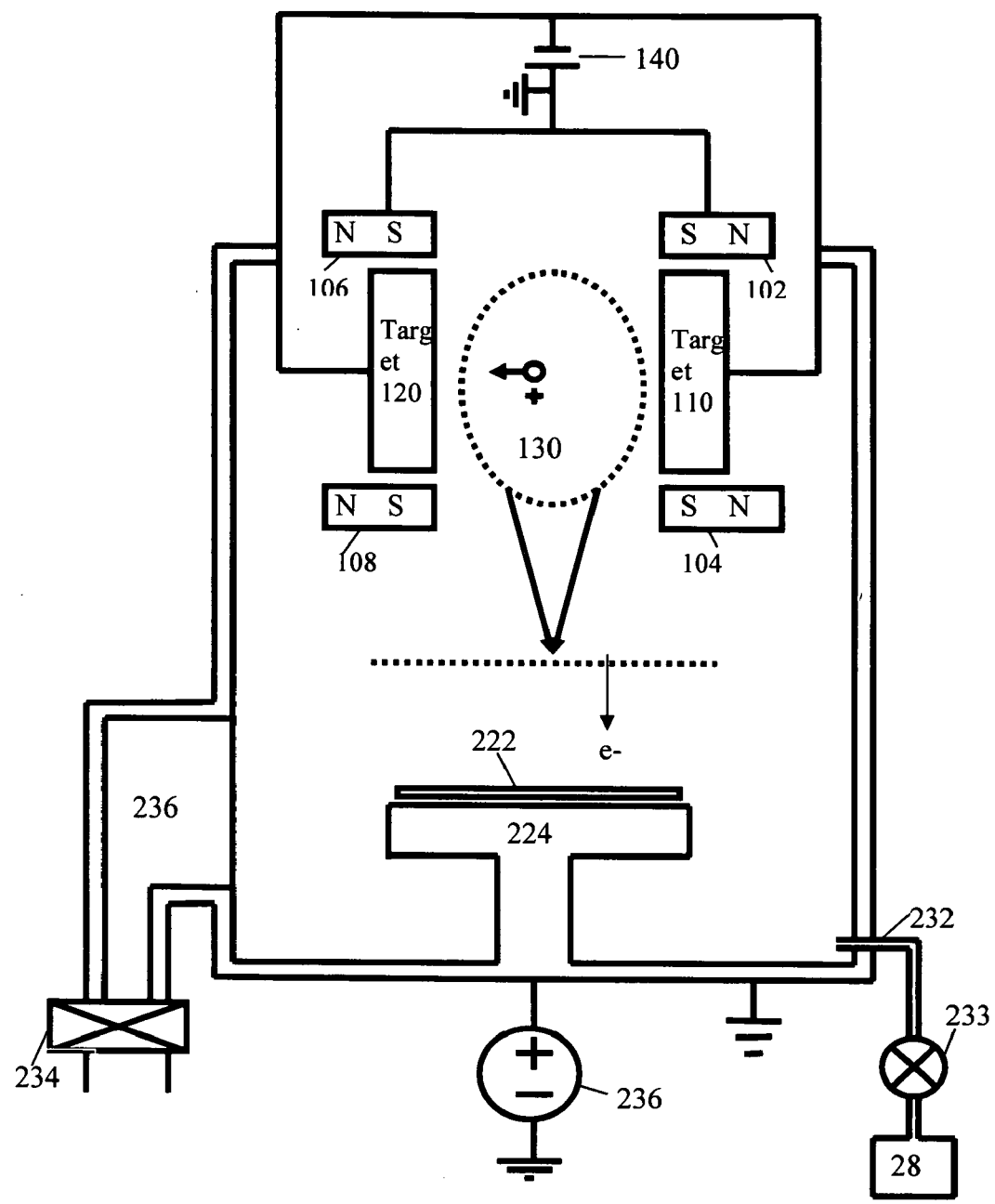
FIG. 1 shows one embodiment of an apparatus for fabricating semiconductor.

Referring now to the drawings in greater detail, there is illustrated therein structure diagrams for a semiconductor processing system and logic flow diagrams for processes a system will utilize to deposit a memory device at low temperature, as will be more readily understood from a study of the diagrams.

FIG. 1 shows one embodiment of an apparatus for fabricating semiconductor. An embodiment reactor 10 is schematically illustrated in FIG. 1. The reactor 10 includes a metal chamber 14 that is electrically grounded. A wafer or substrate 22 to be sputter coated is supported on a pedestal electrode 24 in opposition to the target 16. An electrical bias source 26 is connected to the pedestal electrode 24. Preferably, the bias source 26 is an RF bias source coupled to the pedestal electrode 24 through an isolation capacitor. Such bias source produces a negative DC self-bias VB on the pedestal electrode 24 on the order of tens of volts. A working gas such as argon is supplied from a gas source 28 through a mass flow controller 30 and thence through a gas inlet 32 into the chamber. A vacuum pump system 34 pumps the chamber through a pumping port 36.

An FTS unit is positioned to face the wafer 22 and has a plurality of magnets 102, 104, 106, and 108. A first target 110 is positioned between magnets 102 and 104, while a second target 120 is positioned between magnets 106 and 108. The first and second targets 110 and 120 define an electron confining region 130. A power supply 140 is connected to the magnets 102-108 and targets 110-120 so that positive charges are attracted to the second target 120. During operation, particles are sputtered onto a substrate 150 which, in one embodiment where the targets 110 and 120 are laterally positioned, is vertically positioned relative to the lateral targets 110 and 120. The substrate 150 is arranged to be perpendicular to the planes of the targets 110 and 120. A substrate holder 152 supports the substrate 150.

The targets 110 and 120 are positioned in the reactor 10 in such a manner that two rectangular shape cathode targets face each other so as to define the plasma confining region 130 therebetween. Magnetic fields are then generated to cover vertically the outside of the space between facing target planes by the arrangement of magnets installed in touch with the backside planes of facing targets 110 and 120. The facing targets 110 and 120 are used a cathode, and the shield plates are used as an anode, and the cathode/anode are connected to output terminals of the direct current (DC) power supply 140. The vacuum vessel and the shield plates are also connected to the anode.

Under pressure, sputtering plasma is formed in the space 130 between the facing targets 110 and 120 while power from the power source is applied. Since magnetic fields are generated around the peripheral area extending in a direction perpendicular to the surfaces of facing targets 110 and 120, highly energized electrons sputtered from surfaces of the facing targets 110 and 120 are confined in the space between facing targets 110 and 120 to cause increased ionized gases by collision in the space 130. The ionization rate of the sputtering gases corresponds to the deposition rate of thin films on the substrate 22, then, high rate deposition is realized due to the confinement of electrons in the space 130 between the facing targets. The substrate 22 is arranged so as to be isolated from the plasma space between the facing targets 110 and 120.

Film deposition on the substrate 22 is processed at a low temperature range due to a very small number of impingement of plasma from the plasma space and small amount of thermal radiation from the target planes. A typical facing target type of sputtering method has superior properties of depositing ferromagnetic materials at high rate deposition and low substrate temperature in comparison with a magnetron sputtering method. When sufficient target voltage VT is applied, plasma is excited from the argon. The chamber enclosure is grounded. The RF power supply 26 to the chuck or pedestal 24 causes an effective DC 'back-bias' between the wafer and the chamber. This bias is negative, so it repels the low-velocity electrons.

Figure 2:
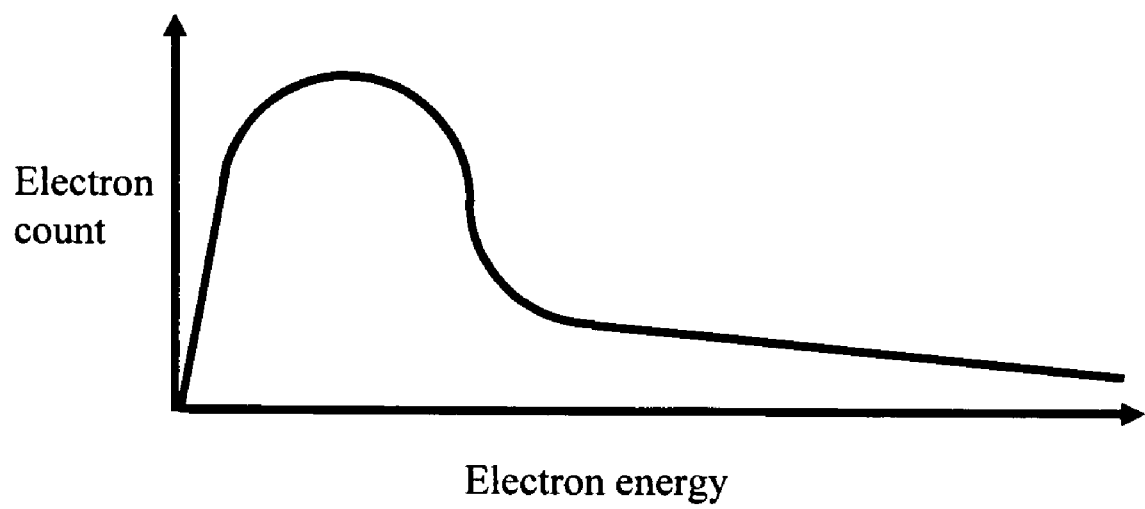
FIG. 2 is an exemplary electron distribution chart.

FIG. 2 illustrates an exemplary electron distribution for the apparatus of FIG. 1. The electron distribution follows a standard Maxwellian curve. Low energy electrons have two characteristics: they are numerous and they tend to have non-elastic collisions with the deposited atoms, resulting in amorphization during deposition. High-energy electrons come through the back-biased shield, but they effectively "bounce" off the atoms without significant energy transfer—these electrons do not affect the way bonds are formed. This is especially true because high energy electrons spend very little time in the vicinity of the atoms, while the low energy electrons spend more time next to the atoms and can interfere with bond formation.

The presence of the large positively biased shield affects the plasma, particularly close to the pedestal electrode 24. As a result, the DC self-bias developed on the pedestal 24, particularly by an RF bias source, may be more positive than for the conventional large grounded shield, that is, less negative since the DC self-bias is negative in typical applications. It is believed that the change in DC self-bias arises from the fact that the positively biased shield drains electrons from the plasma, thereby causing the plasma and hence the pedestal electrode to become more positive.

Figure 3:
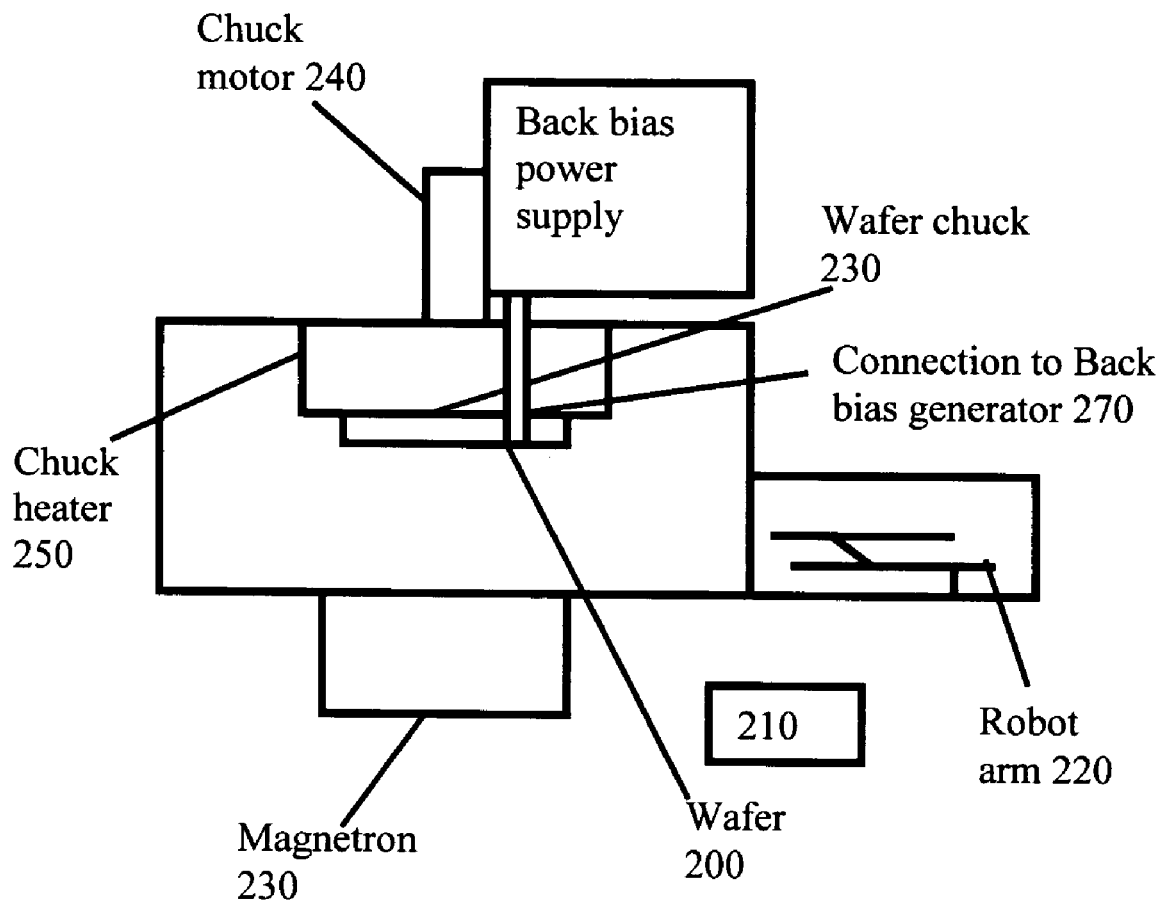
FIG. 3 shows one embodiment of a FTS unit.

FIG. 3 shows another embodiment of an FTS system. In this embodiment, a wafer 200 is positioned in a chamber 210. The wafer 200 is moved into the chamber 210 using a robot arm 220. The robot arm 220 places the wafer 200 on a wafer chuck 230. The wafer chuck 230 is moved by a chuck motor 240. One or more chuck heaters 250 heats the wafer 200 during processing.

Additionally, the wafer 200 is positioned between the heater 250 and a magnetron 260. The magnetron 260 serves as highly efficient sources of microwave energy. In one embodiment, microwave magnetrons employ a constant magnetic field to produce a rotating electron space charge. The space charge interacts with a plurality of microwave resonant cavities to generate microwave radiation. One electrical node 270 is provided to a back-bias generator such as the generator 26 of FIG. 1.

In the system of FIG. 3, two target plates are respectively connected and disposed onto two target holders which are fixed to both inner ends of the chamber 210 so as to make the target plates face each other. A pair of permanent magnets are accommodated in the target holders so as to create a magnetic field therebetween substantially perpendicular to the surface of the target plates. The wafer 200 is disposed closely to the magnetic field (which will define a plasma region) so as to preferably face it. The electrons emitted from the both target plates by applying the voltage are confined between the target plates because of the magnetic field to promote the ionization of the inert gas so as to form a plasma region. The positive ions of the inert gas existing in the plasma region are accelerated toward the target plates. The bombardment of the target plates by the accelerated particles of the inert gas and ions thereof causes atoms of the material forming the plates to be emitted. The wafer 200 on which the thin film is to be disposed is placed around the plasma region, so that the bombardment of these high energy particles and ions against the thin film plane is avoided because of effective confinement of the plasma region by the magnetic field. The back-bias RF power supply causes an effective DC 'back-bias' between the wafer 200 and the chamber 210. This bias is negative, so it repels the low-velocity electrons.

Figure 4A:
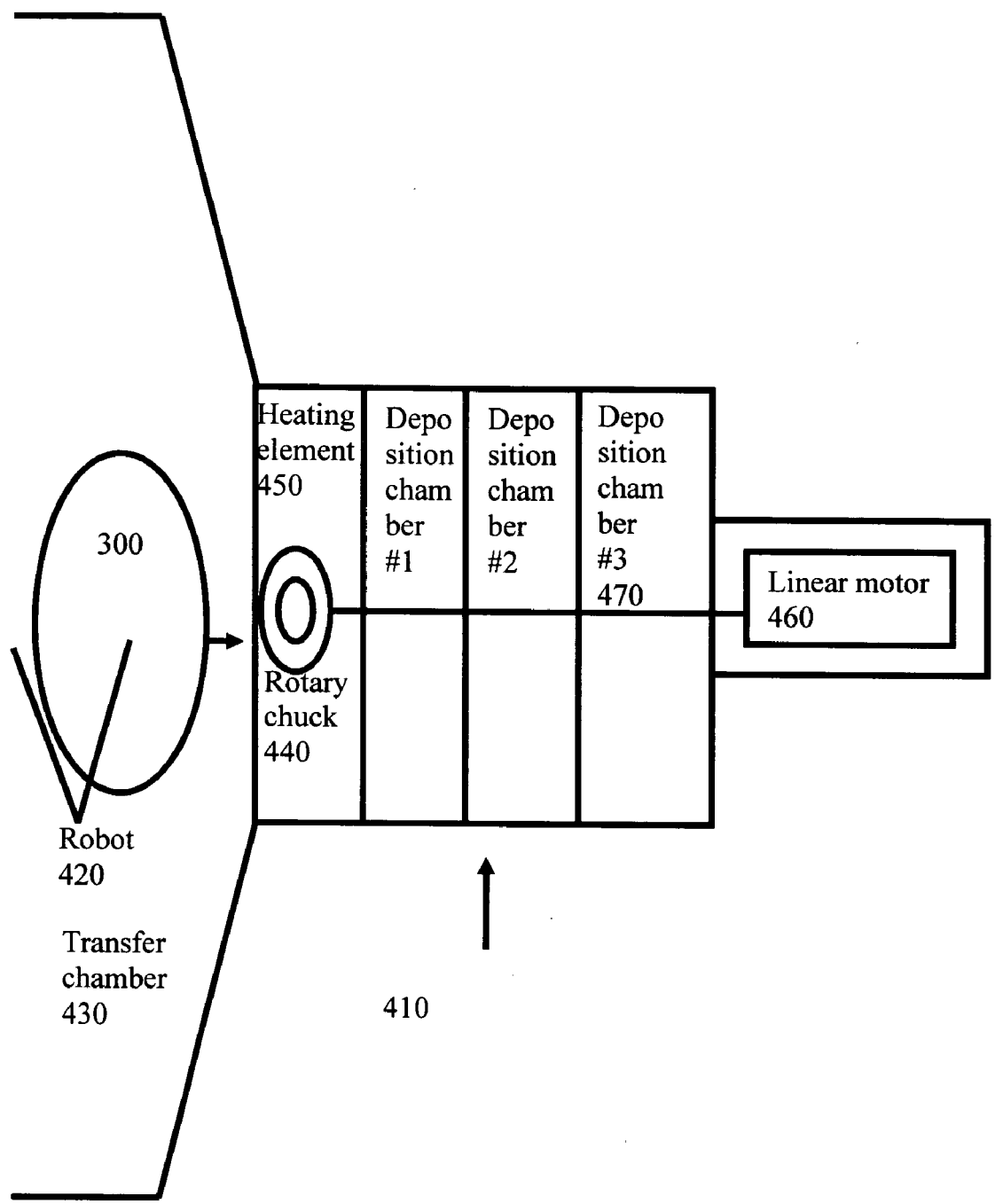
FIGS. 4A-4B show additional embodiments of the apparatus for fabricating semiconductor.

FIG. 4A shows one embodiment of an apparatus for fabricating semiconductor. In the system of FIG. 4A, multiple 1-D deposition sources are stacked in the deposition chamber. The stacking of the sources reduces the amount of wafer travel, while significantly increasing deposition uniformity. A wafer 300 is inserted into a chamber 410 using a robot arm 420 moving through a transfer chamber 430. The wafer 300 is positioned onto a rotary chuck 440 with chuck heater(s) 450 positioned above the wafer. A linear motor 460 moves the chuck through a plurality of deposition chambers 470.

The system of FIG. 4A provides a plurality of one dimensional sputter deposition chambers. Each chamber can deposit a line of material. By moving the wafer 300 with the linear motor 460, 2-d coverage is obtained.

In one embodiment, a process for obtain 2D deposition coverage is as follows:

Receive desired 2D pattern from user
Move chuck into a selected deposition chamber;
Actuate linear motor and rotary chuck to in accordance with the 2D pattern
Move current wafer to next deposition chamber
Get next wafer into the current chamber and repeat process.

Figure 4B:
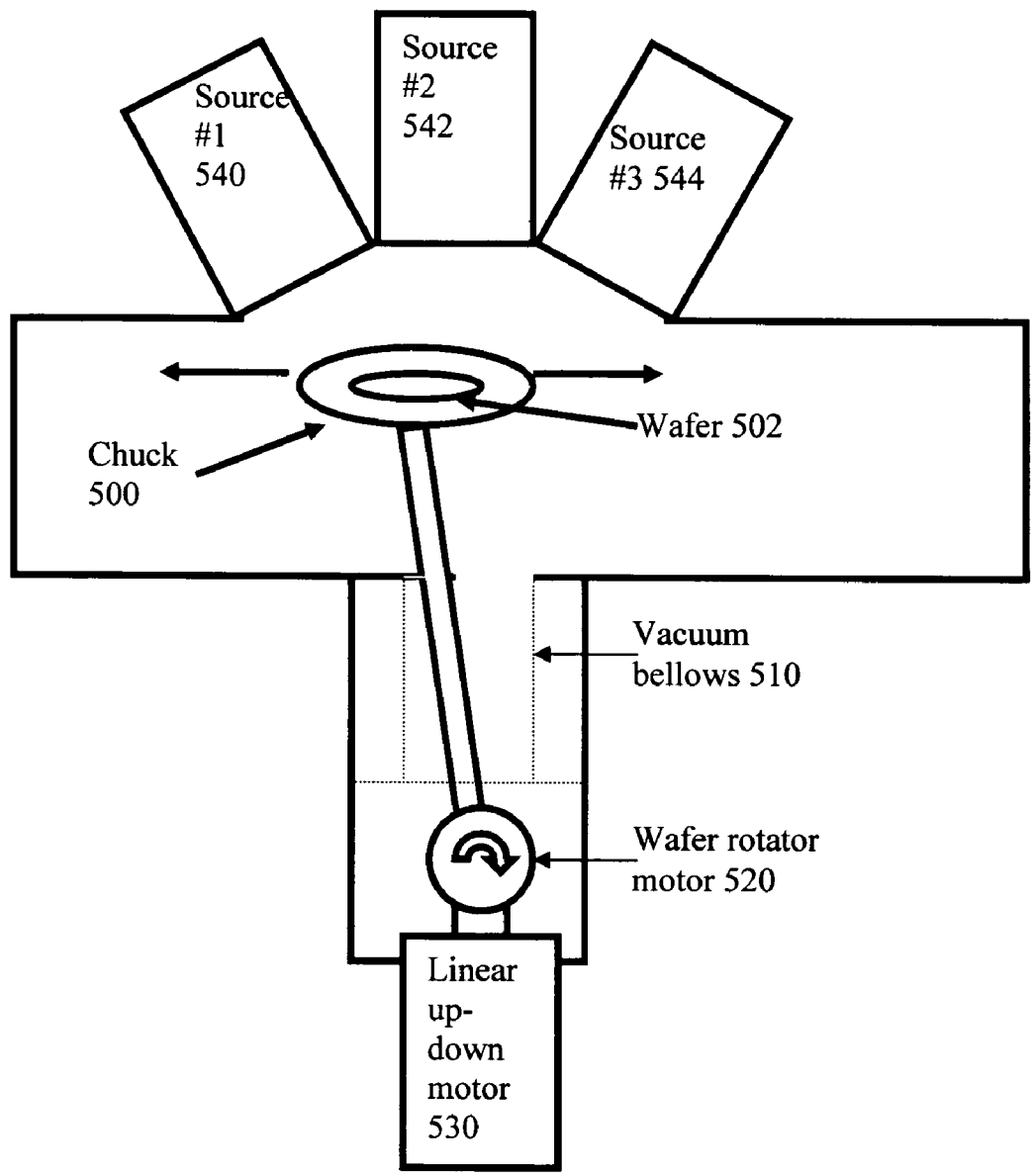

Turning now to FIG. 4B, a second embodiment of a fabrication apparatus is shown. In this embodiment, a chuck 500 is positioned inside a chamber. The chuck 500 supports a wafer 502. The chamber has vacuum bellows 510. The chuck 500 is driven by a wafer rotator 520 which rotates the wafer 502. The chuck 500 and the wafer 502 has a pendulum motion. The chuck 500 is also powered by a linear motor 530 to provide up/down motion. A plurality of sources 540-544 perform deposition of materials on the wafer 502.

The system of FIG. 4B gets linear motion of the wafer 502 past the three sources for uniform deposition. The system has a jointed pendulum to support the wafer and keep the wafer at a constant vertical distance from the target as the pendulum swings. The system is more stable than a system with a lateral linear arm since the chuck 500 is heavy and supports the weight of the wafer, a heater, and RF backbias circuitry and would require a very thick support arm otherwise the arm would wobble. Also, the linear arm would need to extend away from the source, resulting in large equipment. In this implementation, the arm sits below the chuck, resulting in a smaller piece of equipment and also the arm does not have to support much weight. The pendulum avoids the use of a long linear arm which wobbles and adds at least 4 feet of equipment size. The pendulum holds the wafer much more securely because the chuck is supported from underneath rather than from the side.

Figure 5:
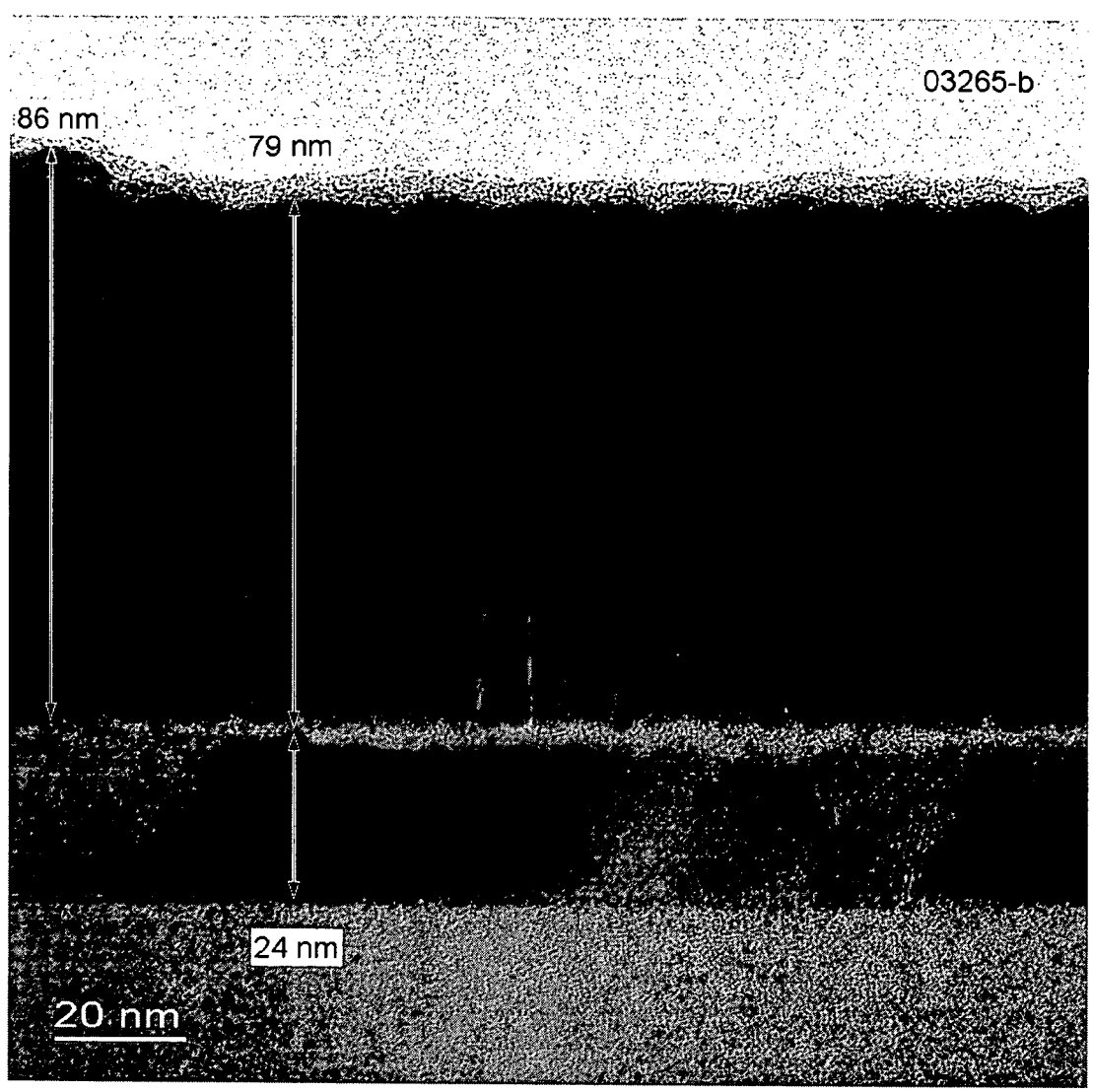
FIG. 5 shows an SEM image of a cross sectional view of an exemplary device fabricated with the system of FIG. 1.
Figure 6:
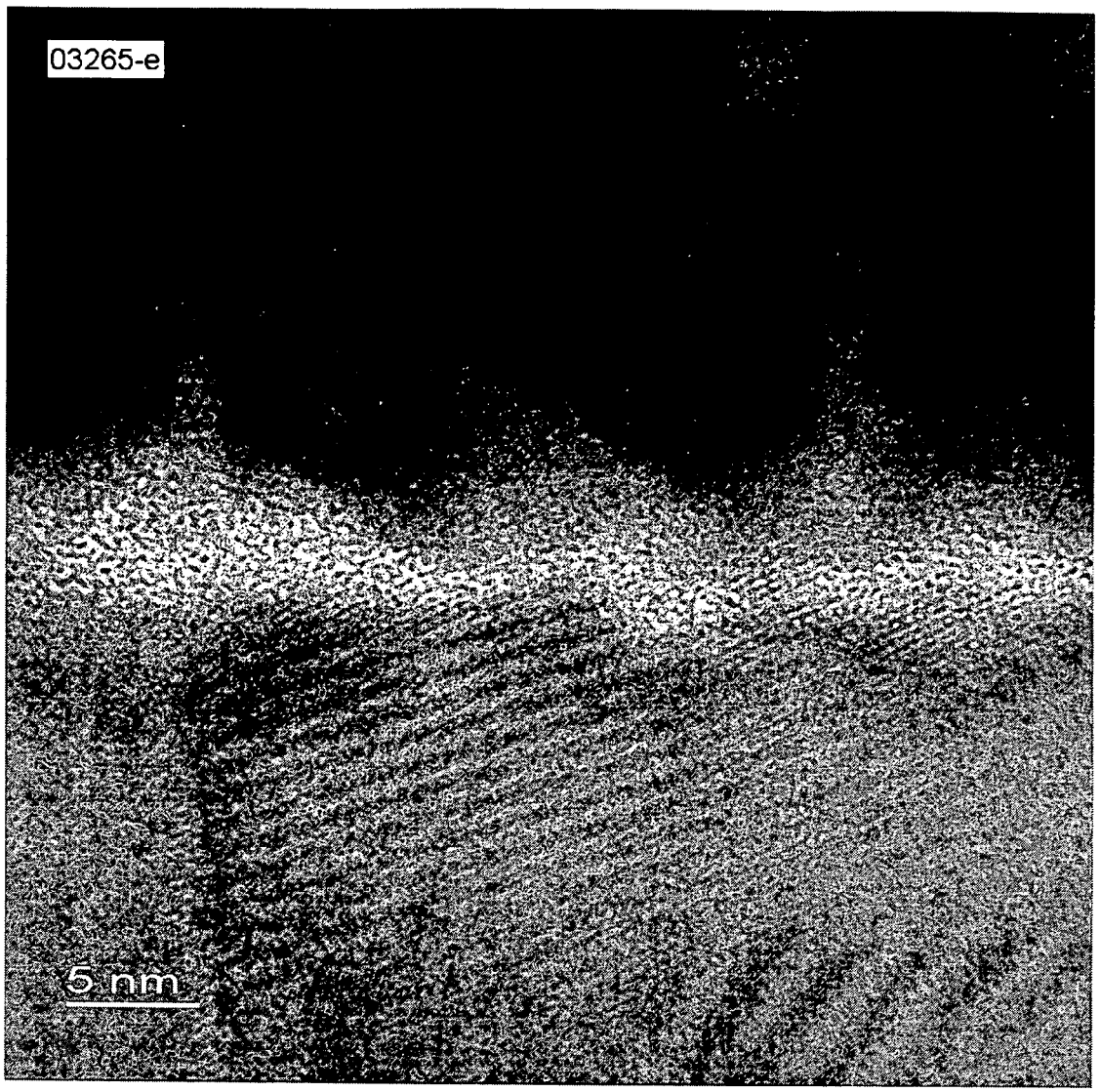
FIG. 6 is an enlarged view of one portion of the SEM image of FIG. 5.

FIG. 5 shows an SEM image of an exemplary device fabricated with the system of FIG. 1, while FIG. 6 is an enlarged view of one portion of the SEM image of FIG. 5. The device of FIG. 5 was fabricated at a low temperature (below 400° C.). At the bottom of FIG. 5 is an oxide layer (20 nm thick). Above the oxide layer is a metal layer, in this case a titanium layer (24 nm thick). Above this layer is an interface layer, in this case a platinum (Pt) interface face layer (about 5 nm). Finally, a crystallite PCMO layer (79 nm thick) is formed at the top. Grains in this layer can be seen extending from the bottom toward the top with a slightly angled tilt. FIG. 6 shows a zoomed view showing the Ti metal layer, the Pt interface layer and the PCMO grain in more details.

Figure 7A:
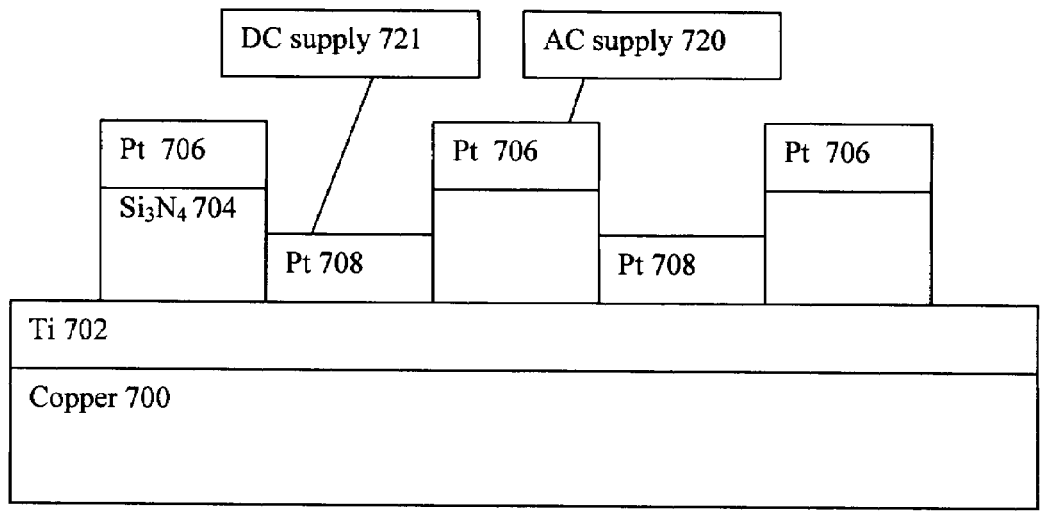
FIGS. 7A-7C illustrate an exemplary deposition sequence.
Figure 7B:
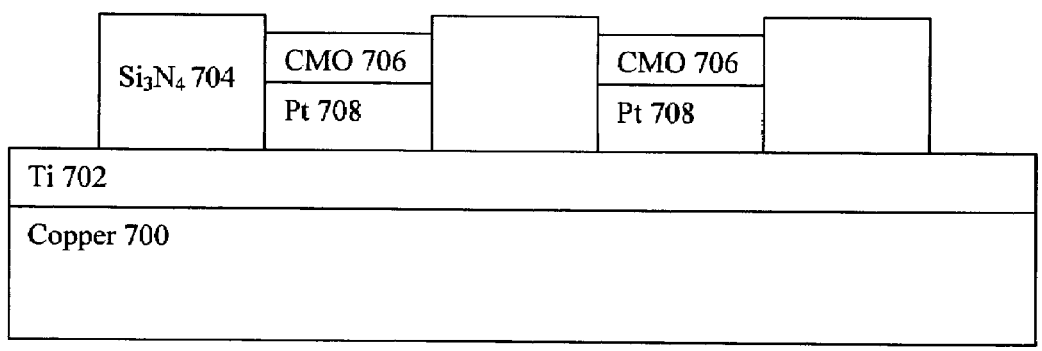
Figure 7C:
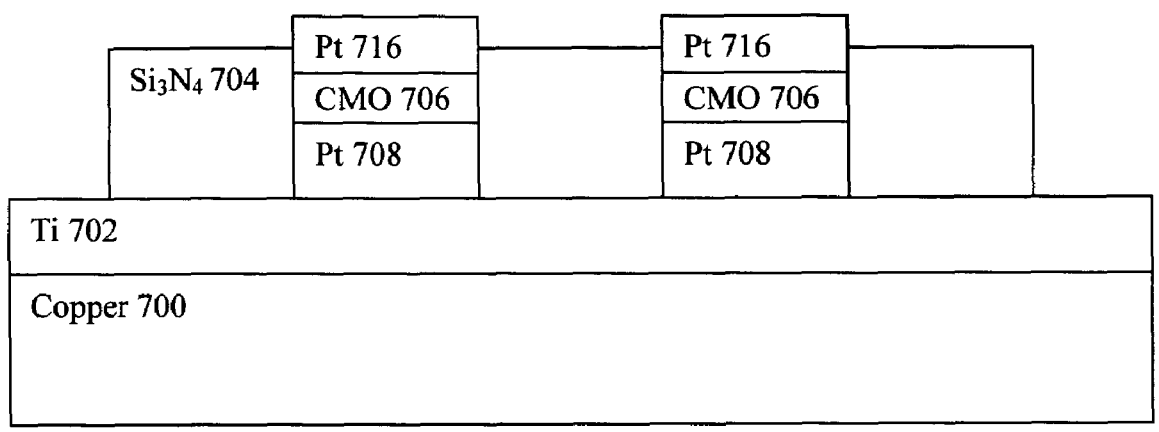

FIGS. 7A-7C illustrate an exemplary deposition sequence for the above described equipment. In this case, the process deposits a layer of material on the substrate and exposes a resist film to an electron beam and then develop the resist film to form a pattern on the resist film. A mask material is deposited, and the resist film is dissolved to form a mask. Next, the substrate is back-biased and a part of the film which is not covered by said mask is removed by face target sputtering with a metal to form a pattern on the layer.

In FIG. 7A, a copper layer 700 is deposited. Above the copper layer 700, a titanium layer 702 is deposited. Both layers are lithographically patterned to create lines which will be used to connect the memory cells. Next, a silicon nitride layer 704 is formed and patterned with holes to allow electrical contact to the platinum layer underneath. Next a platinum layer 708 is formed above the titanium layer 702. A platinum layer 706 is then formed above the silicon dioxide layer 704. The platinum layer 706 is deposited anisotropically, resulting in a disconnect between the platinum over the silicon nitride and the platinum over the titanium exposed by the silicon nitride holes.

In FIG. 7B, the platinum layer 706 is removed by bombardment from positive ions. The ions are accelerated near the surface by a dual voltage imposed on the metallized surface. The portions of the platinum laying on the insulating silicon nitride are negatively charged by the large negative AC voltage 720, causing an enhanced etch rate. This voltage is AC coupled to the platinum layer through the silicon nitride layer. The platinum connected to the titanium 702 is connected to an only slightly negative DC voltage 721, resulting in virtually no etching. As the platinum is etched off the silicon nitride, CMO layers 706, 710 and 712 are formed above the wafer of FIG. 7A. CMO does not form on the silicon nitride because the high negative voltage causes any deposited ions to be re-sputtered by new positive ions. In FIG. 7C, platinum layers 714-716 are deposited above the CMO layers 706 and 710, respectively. Again, the platinum is only deposited on top of the CMO because of the favorable bias. This biasing etch-deposition process can be used to deposit the entire platinum-CMO memory stack in the deposition chamber without breaking vacuum, and without the need of an intermediate lithography step to define the stack. After the CMO-platinum stack is formed, a dielectric layer is deposited and planarized with chemical-mechanical polishing. The part is then completed using a standard copper damascene process.

Figure 8:
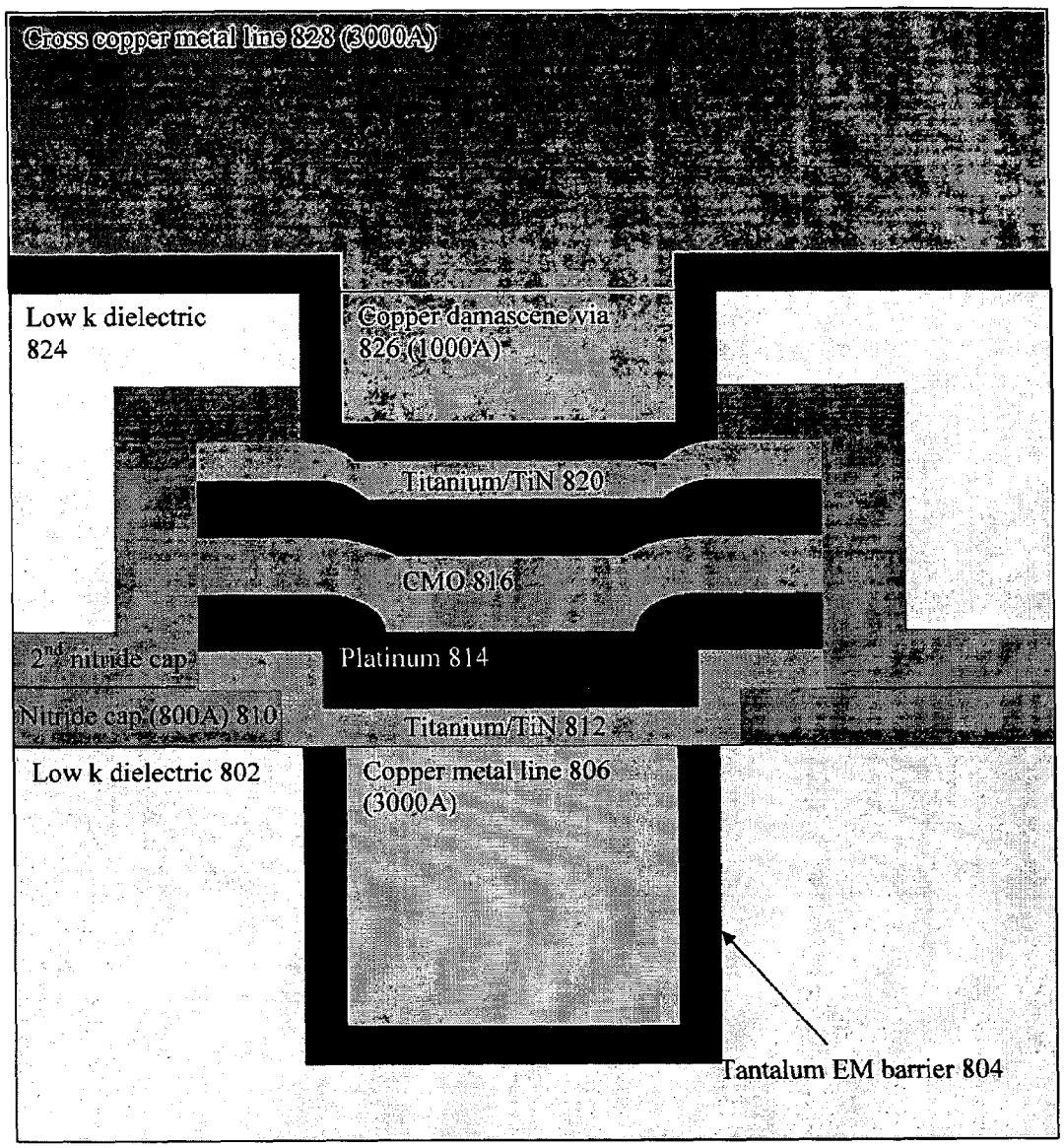
FIG. 8 shows an exemplary cross-section view of a device fabricated in accordance with the above-described system.

FIG. 8 shows an exemplary cross-section view of a device fabricated in accordance with the above described system. A low constant dielectric layer 802 is formed above the substrate. A tantalum electromigration barrier 804 isolates a metal line 806 from the dielectric layer 802. Above the dielectric layer 802 is a nitride isolation layer 810. Another low constant dielectric layer 824 is positioned above the second nitride isolation layer 810. In one embodiment, the layer 810 is 300 Angstroms thick. A cross copper metal line 828 is formed above the entire section. In one embodiment, the metal line 828 is 1000 Angstroms thick.

Above the metal line 806 is a titanium or titanium nitride layer 812. A platinum layer 814 is then formed. A CMO layer 816 is then sandwiched between the platinum layer 814 and a second platinum layer 818. Another titanium or titanium nitride layer 820 is formed above the platinum layer 818. Further, a copper damascene via 826 is formed between the copper metal line 828 and the titanium or titanium nitride layer 820. In one embodiment, the damascene via is 1000 Angstroms thick.

Although one or two back-biased power supplies are mentioned, a plurality of back-bias power supplies can be used. These power supplies can be controllable independently from each other, and their operating frequency can be varied. The electric energies supplied can be independently controlled. Therefore, the components of the thin film to be formed are easily controlled in every sputtering batch process. In addition, the composition of the thin film can be changed in the direction of the thickness of the film by using the Facing Targets Sputtering device.

It is to be understood that various terms employed in the description herein are interchangeable. Accordingly, the above description of the invention is illustrative and not limiting. Further modifications will be apparent to one of ordinary skill in the art in light of this disclosure.

The invention has been described in terms of specific examples which are illustrative only and are not to be construed as limiting. The invention may be implemented in digital electronic circuitry or in computer hardware, firmware, software, or in combinations of them.

Apparatus of the invention for controlling the fabrication equipment may be implemented in a computer program product tangibly embodied in a machine-readable storage device for execution by a computer processor; and method steps of the invention may be performed by a computer processor executing a program to perform functions of the invention by operating on input data and generating output. Suitable processors include, by way of example, both general and special purpose microprocessors. Storage devices suitable for tangibly embodying computer program instructions include all forms of non-volatile memory including, but not limited to: semiconductor memory devices such as EPROM, EEPROM, and flash devices; magnetic disks (fixed, floppy, and removable); other magnetic media such as tape; optical media such as CD-ROM disks; and magneto-optic devices. Any of the foregoing may be supplemented by, or incorporated in, specially-designed application-specific integrated circuits (ASICs) or suitably programmed field programmable gate arrays (FPGAs).

While the preferred forms of the invention have been shown in the drawings and described herein, the invention should not be construed as limited to the specific forms shown and described since variations of the preferred forms will be apparent to those skilled in the art. Thus the scope of the invention is defined by the following claims and their equivalents.

What is claimed is:

1. A method for processing a semiconductor substrate, comprising:
   depositing a conductive layer on the substrate;
   patterning a set of insulating structures on the substrate;
   selectively back-biasing the substrate;
   depositing a layer of material on the substrate; and
   removing a part of the conductive layer selectively biased to attract cation bombardment.

2. The method of claim 1, wherein the metal is platinum.

3. The method of claim 1, further comprising sputtering platinum on the layer.

4. The method of claim 1, wherein the back-biasing further comprises applying more than 250 watts of power.

5. The method of claim 1, wherein the back-biasing can be applied to the substrate through DC conduction or AC capacitive coupling.

6. The method of claim 1, wherein the layer is a CMO layer.

7. The method of claim 1, wherein said mask material used in said reactive ion etching comprises at least one metal selected from the group consisting of titanium, silver, ruthenium, germanium, platinum, palladium, an alloy comprising at least one of the foregoing metals as a main component and a compound thereof.

8. The method of claim 1, further comprising depositing a copper layer above the substrate.

9. The method of claim 8, further comprising depositing a titanium layer above the copper layer.

10. The method of claim 9, further comprising forming a silicon nitride layer and a platinum layer above the titanium layer.

11. The method of claim 10, further comprising forming a platinum layer above the silicon nitride layer.

12. The method of claim 11, further comprising removing the platinum layer and forming CMO layers.

13. The method of claim 12, further comprising depositing platinum layers above the CMO layers.

14. A face target sputtering apparatus to fabricate semiconductors, comprising:
   an air-tight chamber in which an inert gas is admittable and exhaustible;
   a pair of target plates placed at opposite ends of said air-tight chamber respectively so as to face each other and form a plasma region therebetween;
   a pair of magnets respectively disposed adjacent to said target plates such that magnet poles of different polarities face each other across said plasma region thereby to establish a magnetic field of said plasma region between said target plates;
   a substrate holder disposed adjacent to said plasma region, said substrate holder adapted to hold a substrate on which an alloyed thin film is to be deposited; and
   a back-bias power supply coupled to the substrate holder, wherein the substrate is selectively back-biased prior to face target sputtering with a metal to form a pattern on the layer.

15. The apparatus of claim 14, wherein a metal is platinum.

16. The apparatus of claim 15, wherein the platinum is sputtered on the layer.

17. The apparatus of claim 14, wherein the back-bias power supply applies more than 250 watts of power.

18. The apparatus of claim 14, wherein the layer is a PCMO layer.

19. The apparatus of claim 14, wherein a mask material is used in a reactive ion etching comprises at least one metal selected from the group consisting of titanium, magnesium, aluminum, germanium, platinum, and palladium.

20. The apparatus of claim 19, wherein the mask material is an alloy comprising at least one of said metals.

* * * * *